(12) United States Patent
Zhang et al.

(10) Patent No.: US 6,803,261 B2
(45) Date of Patent: Oct. 12, 2004

(54) PHOTOELECTRIC CONVERTER AND FABRICATION METHOD THEREOF

(75) Inventors: Hongyong Zhang, Kanagawa (JP); Masayuki Sakakura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 212 days.

(21) Appl. No.: 10/178,385

(22) Filed: Jun. 24, 2002

(65) Prior Publication Data

US 2002/0158252 A1 Oct. 31, 2002

Related U.S. Application Data

(60) Continuation of application No. 09/882,611, filed on Jun. 15, 2001, now Pat. No. 6,423,569, which is a division of application No. 09/160,619, filed on Sep. 24, 1998, now Pat. No. 6,288,388.

(30) Foreign Application Priority Data

Sep. 26, 1997 (JP) .............................................. 9-279502

(51) Int. Cl.[7] .......................................... H01L 21/339
(52) U.S. Cl. ........................... 438/144; 438/30; 438/60; 438/57; 438/71; 438/98; 438/948
(58) Field of Search ................................ 438/7, 30, 60, 438/57, 71, 98, 144, 948; 430/319, 321

(56) References Cited

U.S. PATENT DOCUMENTS

| | | | |
|---|---|---|---|
| 4,608,749 A | 9/1986 | Harada et al. ............... | 148/172 |
| 4,786,819 A | 11/1988 | Tei ............................... | 250/226 |
| 5,047,090 A | 9/1991 | Hayashi et al. .............. | 250/551 |
| 5,076,857 A | 12/1991 | Nowlan ........................ | 438/71 |
| 5,172,249 A | 12/1992 | Hashimoto ................... | 358/482 |
| 5,258,077 A | 11/1993 | Shahryar ..................... | 136/256 |
| 5,413,959 A | 5/1995 | Yamamoto et al. .......... | 136/256 |
| 5,449,626 A | 9/1995 | Hezel ........................... | 438/71 |
| 5,456,798 A | 10/1995 | Koumura et al. ............. | 216/66 |
| 5,554,229 A | 9/1996 | Vogeli ......................... | 136/256 |
| 5,589,403 A | 12/1996 | Toyama et al. .............. | 438/71 |
| 5,629,113 A | 5/1997 | Watanabe .................... | 430/322 |
| 5,711,824 A | 1/1998 | Shinohara et al. .......... | 136/256 |
| 5,714,790 A | 2/1998 | Sakamoto .................... | 257/291 |
| 5,767,559 A * | 6/1998 | Ito et al. ...................... | 257/431 |
| 6,096,496 A | 8/2000 | Frankel ....................... | 365/129 |
| 6,162,658 A | 12/2000 | Green et al. ................. | 438/57 |
| 6,288,388 B1 * | 9/2001 | Zhang et al. ............. | 250/214.1 |
| 6,294,799 B1 * | 9/2001 | Yamazaki et al. ............ | 257/72 |
| 6,423,569 B2 * | 7/2002 | Zhang et al. ................. | 438/98 |

FOREIGN PATENT DOCUMENTS

| | | |
|---|---|---|
| JP | 4-268763 | 9/1992 |
| JP | 6-300989 | 10/1994 |
| JP | 9-101401 | 4/1997 |

OTHER PUBLICATIONS

Wolf et al. ,Silicon Processing for the VLSI Era, vol. 1–Process Technology, Lattice PRess pp. 407–408, 1986.*
English abstract re Japanese Patent Application 4–268763, published Sep. 24, 1992.
English abstract re Japanese Patent Application 6–300989, published Oct. 28, 1994.
English abstract re Japanese Patent Application 9–101401, published Apr. 15, 1997.

* cited by examiner

Primary Examiner—John F. Niebling
Assistant Examiner—Jennifer M. Kennedy
(74) Attorney, Agent, or Firm—Cook, Alex, McFarron, Manzo, Cummings & Mehler, Ltd.

(57) ABSTRACT

There is provided a laminated type photoelectric converter whose sensitivity is enhanced uniformly. In the photoelectric converter in which a photoelectric conversion device is laminated above a signal transfer device, the sensitivity is enhanced by providing bends on a lower electrode of the photoelectric conversion device and by confining light uniformly.

16 Claims, 6 Drawing Sheets

PHOTOELECTRIC CONVERTER AND FABRICATION METHOD THEREOF

This application is a continuation of U.S. application Ser. No. 09/882,611, Pat. No. 6,423,569 filed on Jun. 15, 2001 which is a divisional of U.S. application Ser. No. 09/160,619, filed on Sep. 24, 1998 (now U.S. Pat. No. 6,288,388 issued Sep. 11, 2001).

BACKGROUND OF THE INVENTION

1. Field of the Invention

The present invention relates to a photoelectric converter in which a photoelectric conversion device is laminated above a signal transfer device and more particularly to improving the sensitivity of such photoelectric converter.

2. Description of Related Art

A photoelectric converter is an apparatus having photoelectric conversion devices. A photoelectric conversion device is a device for converting light energy into electric energy or electric energy into light energy. Among the photoelectric conversion devices, the device for converting light energy (optical signal) into electric energy (electrical signal) includes a photovoltaic device (solar battery) aiming at generating energy and a photo-receiving device for processing signals. The photo-receiving device includes a photo-diode and a photo-transist or utilizing the photovoltaic effect and a photoconductive cell utilizing the photo-conductive effect.

With the advancement of the technology of integrated circuits, an image sensor which is one of photoelectric converter and which is an apparatus in which photo-diodes or photo-conductive cells and signal transfer devices are integrated on one and same device substrate has come to be used widely.

Various measures are taken in the photoelectric conversion device used in the photoelectric converter in order to convert light energy (optical signal) into electric energy (electrical signal) efficiently. For instance, an electrode of the photoelectric conversion device is formed so as to have a texture structure to scatter light within the photoelectric conversion device and to increase a quantity of energy generated by the photoelectric conversion device (solar battery). However, because the scattering of light caused by the texture structure is probabilistic irregular reflection, it cannot be controlled intentionally and it is unable to increase electric energy (electrical signal) uniformly.

What is drawing special attention lately among the photoelectric converters is the image sensor. With the incoming of multi-media, a digital still camera, a cam-coder and the like using the image sensor are now rapidly spreading and the research on the improvement of the efficiency (conversion efficiency) for converting optical signals entering the image sensor into electric signals is being actively conducted. Because the photoelectric conversion devices and the signal transfer devices are disposed on one and same plane of the same device substrate in the image sensor, regions of the signal transfer devices of the image sensor turn out to be dead spaces where no photoelectric conversion can be made. Then, there has been proposed an image sensor in which a micro lens is provided in order to condense optical signals to a region of the photoelectric conversion device in the photoelectric converter.

There has been also proposed a laminated type image sensor as shown in FIG. 2 in which a photoelectric conversion device is laminated on a signal transfer device to allot functions of photoelectric conversion and of signal transfer in the vertical direction. FIG. 2 is a section view of one pixel of the laminated type image sensor. In the laminated type image sensor, the photoelectric conversion device 202 is formed on a substrate on which the signal transfer device 201 is integrated. Because the dead space may be almost eliminated by constructing the micro lenses as shown in FIG. 2, as compared to the image sensor in which the photoelectric conversion device and the signal transfer device are disposed on one and same plane, the area of the photoelectric conversion device of the image sensor may be increased.

Although FIG. 2 shows a MOS image sensor using a top gate type MOS transistor for the signal transfer device 201, the laminated type image sensor may be constructed by using a CCD image sensor in which a MOS capacitor is utilized for the signal transfer device and an image sensor using another signal transfer device.

With the rapid spread of the image sensors, it is demanded to miniaturize and lower the cost of the image sensor further. In fact, the size of the image sensors is becoming small year by year and the size of an optical system which decides the size of the image sensor has reduced from ⅔ inches in the 1980s to ¼ inches of the present day. Actually, an image sensor for a ¼ inches camera is now being commercialized. The image sensor may be also fabricated at low cost by miniaturizing the optical system of the image sensor.

To obtain a high image quality image sensor having the same or higher resolution with/over the prior art one while reducing its size, the image sensor must be densified by reducing the size of one pixel. In fact, the size of the pixel is becoming small along the reduction of the size of the optical system of the image sensor and an image sensor having pixels whose size is 10 $\mu$m×10 $\mu$m or less is being commercialized. It is then expected that the reduction of the size of the pixel advances further for the future.

When the size of one pixel of the image sensor is small, optical signals entering one pixel also decrease accordingly. Then, because electric signals converted by the photoelectric conversion device of the image sensor decrease, i.e., electric charges are generated less, the relative rate of noise generated by the electrical effects in and out of the apparatus to the quantity of generated electric charges increases, thus dropping the sensitivity.

As described above, there arises a problem that the sensitivity of the image sensor drops when the size of one pixel of the image sensor is reduced in order to obtain the small and high image quality image sensor. The problem of the drop of the sensitivity of the image sensor which occurs when the size of the pixel is reduced cannot be solved fully just by providing the prior art micro lens or by laminating the photoelectric conversion device with the signal transfer device.

The sensitivity may be enhanced by increasing the quantity of generated electric charges by confining light in a photoelectric conversion layer of the image sensor. However, when the photoelectric conversion device having the electrode in the texture structure is used for the image sensor, scattered light cannot be controlled and the sensitivity disperses among the respective pixels.

SUMMARY OF THE INVENTION

Accordingly, it is an object of the present invention to obtain an image sensor whose sensitivity is improved and having pixels having uniform sensitivity.

It is another object of the present invention to obtain a photoelectric converter, beside the image sensor, whose sensitivity is improved and having photoelectric conversion devices having uniform sensitivity.

The sensitivity may be improved by converting optical signals (hereinafter referred to simply as light) which has entered the photoelectric conversion device of the photoelectric converter into electric signals (hereinafter referred to as electrical charges) efficiently. In order to confine light uniformly, the present invention collects and controls light by utilizing reflection, condensation and dispersion of light, noticing on an electrode used in the photoelectric conversion device of the photoelectric converter.

A first arrangement of an inventive photoelectric converter is characterized in that in a laminated type photoelectric converter, an organic resin film is provided above a signal transfer device, a photoelectric conversion device is provided above the organic resin film and a lower electrode of the photoelectric conversion device has bends.

FIG. 1 shows the first arrangement of the invention. FIG. 1 is a section view of one pixel of the photoelectric converter in which a signal transfer device 101 and a photoelectric conversion device 102 are laminated. The photoelectric conversion device 102 comprises a lower electrode 104, a photoelectric conversion layer 106 and an upper electrode 105. An organic resin film 103 is provided above the signal transfer device 101 and the lower electrode 104 of the photoelectric conversion device has the bends.

As shown in FIG. 1 which shows the section of one pixel of the photoelectric converter, the three bends are provided on the lower electrode of one pixel. That is, nine bends of 3×3 are created in one pixel of the photoelectric converter shown in FIG. 1.

The lower electrode 104 having the bends has a large light confining effect. It can also confine light uniformly because it has a light condensing function. Preferably, the disposition of the bends of the lower electrode is kept same in each pixel in order to prevent the sensitivity of each pixel from dispersing.

The sensitivity may be enhanced uniformly by providing bends also on the upper electrode to disperse light intentionally by the upper electrode in reflecting the light condensed by the lower electrode 104 again by the upper electrode 105 and by repeating the dispersion and condensation by the upper and lower electrodes.

A second arrangement of the inventive photoelectric converter is characterized in that in the first arrangement of the invention, a material of the lower electrode of the photoelectric conversion device or of the surface thereof in particular is a metallic material selected among aluminum, molybdenum, tantalum, titanium, gold, silver and platinum.

Because the first arrangement of the invention is characterized in that the lower electrode of the photoelectric conversion device has the bends and light which has not been converted into electrical charges is reflected and condensed by the bends, i.e., the reflected light is condensed by the lower electrode, it is essential to use a material having a high reflectance as the material for the surface of the lower electrode.

A third arrangement of the inventive photoelectric converter is characterized in that in the first or second arrangement of the invention, the difference between the top and bottom of the bend of the lower electrode of the photoelectric conversion device is 0.25 to 4 μm. The difference between the top and bottom of the bend is limited by an ultraviolet transmitting thickness of resist used in forming the bends.

The difference (110 in FIG. 1) between the top and bottom of the bend of the lower electrode of the photoelectric conversion device is influential in an angle of reflection. Because the present invention reflects and condense light by utilizing bends, it requires bends having a large difference between the top and bottom of a certain degree, i.e., bends having a large angle of reflection of a certain degree.

The bend of the lower electrode of the photoelectric conversion device may be formed into the shape of a cylindrical lens, beside that of a spherical lens.

A fourth arrangement of the inventive photoelectric converter is characterized in that in the first through third arrangements, the bend of the lower electrode of the photoelectric conversion device is larger than a contact hole for connecting the lower electrode with the signal transfer device and is smaller than one pixel.

The fourth arrangement of the invention will be explained by using FIG. 1. As shown in FIG. 1, the size 111 of the bend of the lower electrode of the photoelectric conversion device is larger than the contact hole 112 for connecting the lower electrode 104 with the signal transfer device 101 and is smaller than the size 113 of one pixel. Although the photoelectric converter shown in the section view of FIG. 1 has the three bends, it may have one or two bends or three or more bends.

A fifth arrangement of the inventive photoelectric converter is characterized in that in the first through fourth arrangements, a material of the organic resin film is an organic resin selected among polyimide, polyamide, polyimide-amide and acrylic resin.

It is noted that the signal transfer device in the present specification includes all of signal transfer devices having at least a function for storing electrical signals converted by the photoelectric conversion device, a function for switching the functions for storing and reading signals and a function for selecting pixel position. It also includes a signal transfer device having an amplifying function, beside the reading function.

Therefore, although a MOS transistor is used in the signal transfer device shown in FIG. 1, it is possible to use a MOS capacitor, a signal transfer device in which a MOS transistor and a MOS capacitor are combined or another signal transfer device. Then, although a MOS type image sensor is used as the image sensor in FIG. 1, it is possible to use a CCD image sensor, a CID image sensor, a CPD image sensor and an image sensor in which they are combined.

Further, the use of the present invention allows a surface area of the photoelectric conversion layer to be widened, thus enhancing the efficiency of the photoelectric conversion.

Although the photoelectric converter of the first arrangement of the invention may be fabricated, i.e., the bends may be created on the surface of the lower electrode of the photoelectric conversion device, by etching the lower electrode isotropically, the bends are created on the organic resin film below the lower electrode and then the lower electrode having the bends is created thereabove according to a sixth arrangement of the invention in order to create the uniform and smooth bends.

That is, the sixth arrangement of the invention pertains to a method for fabricating the inventive photoelectric converter of the first arrangement, i.e., the photoelectric converter shown in FIG. 1.

FIGS. 1, 3 and 6 show the sixth arrangement of the invention, i.e. the method for fabricating the photoelectric conversion device shown in FIG. 1. At first, as shown in FIG. 3a, the signal transfer device 101 is formed on a substrate 107 and an organic resin flattening film 301 is formed above the signal transfer device 101. Next, a resist 302 is formed on the flattening film 301 as shown in FIG. 3b and bends are created on the resist 302 as shown in FIG. 3c. Then, the flattening film 301 is etched almost in the same shape with the bends of the resist 303 to obtain a structure shown in FIG. 3d. After that, the photoelectric converter of the first arrangement is fabricated by creating a contact hole, by forming the lower electrode 104 of the photoelectric conversion device and by forming the photoelectric conversion layer 106 and the upper electrode 105 on the lower electrode 104 as shown in FIG. 1.

The bends shown in FIG. 3c are created on the organic resin flattening film 301 by using the method of forming the bends by patterning the resist 302 and by etching it.

As the patterning method, there are methods of 1) adhering a pattern on the substrate and exposing in batch and 2) using a stepper and a mirror projection aligner (MPA) to expose by focusing while keeping off the pattern from the substrate and 3) a proximity method.

With the miniaturization of the device, studies are conducted so as to increase the resolution as much as possible in general. For instance, an optical system is used in order to project the mask pattern to the substrate with better resolution in using the method 2). In contrary to that, the bends are created by lowering the resolution to blur the image and by making the patterning shape ambiguous in the present invention. Considering also that light may turn around because the substrate is separated from the mask, it is possible to create the bends.

Although it is a general practice to adjust the focusing depth and the position of the substrate by using an optical system in order to increase the resolution, the focusing depth and the position of the substrate are shifted intentionally in the present invention. The focusing depth and the position of the substrate may be shifted by shifting the focusing depth by controlling the optical system or by moving the position of the substrate.

The concrete method for creating the bends will be explained below by using FIGS. 6 and 7. FIG. 6a shows a mask on which the pattern in which circles are bored is printed. FIG. 6b shows a section view of the mask 601 along a line A-B in FIG. 6a and a section view of a positive type resist 602. The positive resist placed separately from the mask is exposed by inputting light 605 from above the mask. The light turns around because the resist is separated from the mask and part of the light advances obliquely. When the resist is exposed while shifting a distance 603 between the mask and the resist a little from the focused state, a resist 604 having the concave bends whose patterning shape is ambiguous as shown in FIG. 6c may be created.

Convex bends as shown in FIG. 7c may be created by using a mask 701 in which circular patterns are printed as shown in FIG. 7a and which is what the mask shown in FIG. 6a is reversed and by exposing a positive resist 702 as shown in FIG. 7b in the same manner with the case of using the mask in FIG. 6.

Although the bends having the shape of the spherical lens has been created in the cases shown in FIGS. 6 and 7, bends having a shape of a cylindrical lens may be created by using a mask on which long and thin rectangular shapes are printed.

Either a positive resist or a negative resist may be used for the resist. The bends whose undulations are reversed may be formed by reversing the mask patterns as shown in FIGS. 6 and 7 when the same kind of resist is used. Further, when the same mask pattern is used, the concave and convex bends may be both formed by appropriately using the positive and negative resists. That is, the convex and concave bends may be formed by selecting the mask patterns and the resists appropriately.

The bends may be created directly on the organic resin film without using the resist by using a photosensitive polyimide for the organic resin film (e.g., 301 in FIG. 3a) and by creating the bends by directly patterning the photosensitive polyimide as shown in FIG. 6. As the photosensitive polyimide, a negative resist having a product name of Photoneece and the like are available.

The difference 610 between the top and bottom of the bend of the resist shown in FIG. 6 is limited by a thickness 611 of the resist. Here, the thickness of the resist is a thickness through which the resist can be exposed, i.e., an ultraviolet transmitting thickness of the resist, and is 0.25 to 4 $\mu$m by the present technology. Accordingly, the difference between the top and bottom of the bend is within the range of 0.25 to 4 $\mu$m.

The size of the bend may be controlled by the mask pattern and the shape of the bend may be changed by controlling the size and the difference between the top and bottom of the bend. Preferably, the bend is formed into the shape having approximately a semi-spherical face of a spherical lens or a semi-columnar face of a cylindrical lens.

In the sixth arrangement of the invention, the resist 303 having the bends shown in FIG. 3c is formed by using the above-mentioned method and is then etched to create the bends on the organic resin flattening film 301 shown in FIG. 3. The etching is performed by using a method in which a selection ratio between the resist and the organic resin film is from 1 to 1 to 1 to 2 or preferably almost at 1 to 1.

The lower electrode, the photoelectric conversion layer and the upper electrode of the photoelectric conversion device are formed above the organic resin film having the bends thus fabricated. The bends of the lower electrode are created by using an inorganic material so that they are not flattened. It is also preferable to create the photoelectric conversion layer and the upper electrode by using inorganic materials because bends may be created also on the upper electrode.

A seventh arrangement of the inventive photoelectric converter is characterized in that in the laminated type photoelectric converter, the organic resin film 103 is provided above the signal transfer device 101, the photoelectric conversion device 102 is provided above the organic resin film 103, micro lenses 401 are provided above the upper electrode 105 of the photoelectric conversion device and the lower electrode 104 of the photoelectric conversion device has bends.

This arrangement of the photoelectric converter is what the micro lenses are provided above the photoelectric converter of the first arrangement of the invention.

Hitherto, one micro lens has been created in one pixel in order to collect light to the photoelectric conversion device. However, it is now possible to equalize the size of the photoelectric conversion device almost with the pixel by laminating the devices, so that it is not necessary to collect light any longer.

Meanwhile, light may be taken into the photoelectric conversion device without loss by creating the micro lens on the surface of the device.

Although one each prior art micro lens aiming at condensing light has been provided per each pixel, there have been areas not covered by the lens at four corners of the pixel because the pixel is square and the micro lens is spherical. Then, the inventors et. al. have studied also on a number of micro lenses per pixel.

The areas not covered by the micro lens may be reduced by reducing the size of the micro lens and by disposing a plurality of micro lenses in one pixel so that there is almost no gap between them. Light ends up being absorbed by the micro lens itself if the micro lens is thick. However, the size of one micro lens is reduced and the thickness thereof may be thinned by providing the plurality of micro lenses in one pixel, so that the loss of light may be reduced. Still more, a plurality of light condensing points are brought about by creating the plurality of micro lenses, so that the conversion efficiency may be enhanced.

The size of the micro lenses may be the same with or different from the size of the lower electrode of the photoelectric conversion device. Further, the position of the convex of the micro lens may be aligned with or deviated from the position of the concave or convex of the photoelectric conversion layer. However, it is preferable to align the position of the convex of the micro lens with the position of the concave of the lower electrode because it turns out to be a double convex micro lens whose efficiency is better than that of one-side convex micro lens.

Further, the disposition of the micro lenses in each pixel is kept same in order to equalize the sensitivity of each pixel as much as possible. When there is a micro lens near the boundary of the cell, the sensitivity of the cell is influenced by a slight shift of the patterning. Therefore, it is preferable not to dispose the micro lens near the boundary of the cell.

An eighth arrangement of the invention pertains to a method for fabricating the photoelectric converter of the seventh arrangement. That is, it pertains to a method for fabricating the photoelectric converter in which the photoelectric conversion device 102 is laminated above the signal transfer device 101, i.e., the micro lenses are created above the photoelectric converter of the first arrangement, as shown in FIG. 4. The same method with the sixth arrangement is used up to the step of fabricating the photoelectric converter of the first arrangement.

FIGS. 5 and 7 show the fabrication method thereafter. At first, an organic resin flattening film 501 is formed above the upper electrode 105 on the photoelectric conversion layer and a resist 502 is formed thereon as shown in FIG. 5a. When a positive resist is used for example for the resist, a resist 704 (i.e. 503 in FIG. 5b) having the convex bends as shown in FIG. 7c may be formed by patterning by using the mask 701 as shown in FIG. 7. Then, the micro lenses shown in FIG. 4 may be created by etching the resist such that the etching selection ratio between the resist and the organic resin film is from 1 to 1 to 1 to 2, or preferably almost at 1 to 1.

The specific nature of the invention, as well as other objects, uses and advantages thereof, will clearly appear from the following description and from the accompanying drawings in which like numerals refer to like parts.

DESCRIPTION OF PREFERRED EMBODIMENTS

First Embodiment

Figure 1:
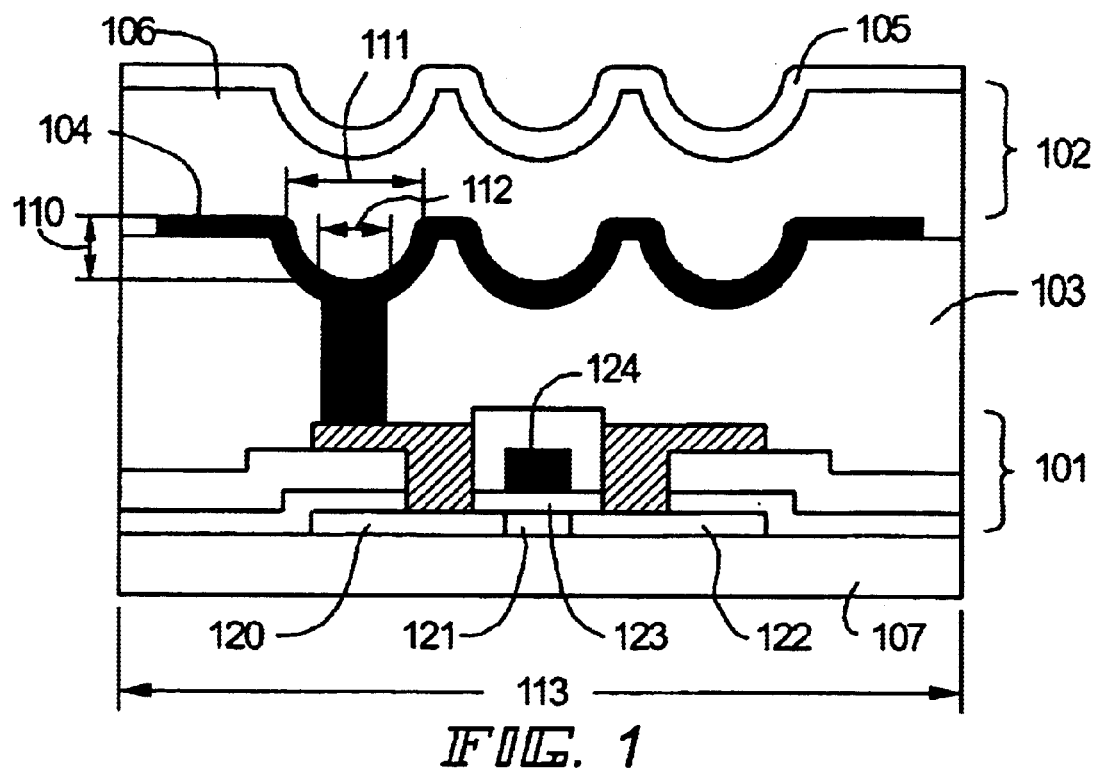
FIG. 1 is a diagrammatic view of a laminated type image sensor.
Figure 2:
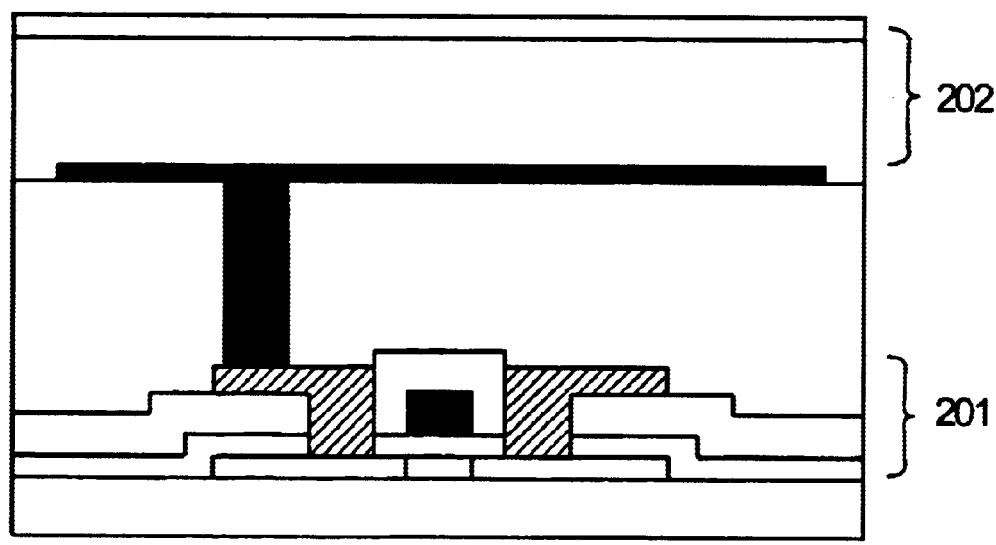
FIG. 2 is a diagrammatic view of a prior art laminated type image sensor.

A first embodiment pertains to a laminated type image sensor in which a lower electrode 104 of a photoelectric conversion device 102 comprising the lower electrode 104, a photoelectric conversion layer 106 and an upper electrode 105 has bends as shown in FIG. 1 and to a fabrication method thereof.

Light may be collected and confined uniformly by creating the bends on the lower electrode 104.

FIG. 1 is a section view of one pixel of photoelectric converter of the present embodiment. In the photoelectric converter of the present embodiment, there is provided a top gate type MOS transistor 101 having a semiconductor layer having a source region 120, a channel region 121 and a drain region 122 as well as a gate insulating film 123 and a gate electrode 124. A polyimide film 103 is provided on the MOS transistor 101.

A size 113 of one pixel is set at 10 $\mu$m×10 $\mu$m in the present embodiment. However, the size of the pixel is not limited only to this size.

Further, a material of the polyimide film 103 provided on the MOS transistor may be another organic resin such as acrylic resin, polyamide and polyimide-amide.

A PIN diode 102 is provided as the photoelectric conversion device on the polyimide film 103 in the present embodiment. An aluminum film 104 is provided as the lower electrode of the PIN diode 102 and an ITO 105 is provided as the upper electrode. The aluminum film 104 has the bends.

Although aluminum having a large reflectivity among metals is provided as the lower electrode of the PIN diode in the present embodiment, a laminate of aluminum with titanium and molybdenum in which aluminum is provided on the surface thereof may be used. Further, molybdenum, tantalum, titanium, gold, silver and platinum which are metals having a large reflectivity beside aluminum may be used as the surface material of the lower electrode.

Although the PIN diode is provided as the photoelectric conversion device in the present embodiment, another photodiode, photo-conductive cell or the like may be provided.

Further, preferably, the disposition of the bends of the aluminum film 104, i.e., the lower electrode of the PIN diode, is kept same per each pixel in order to equalize the sensitivity.

The sensitivity may be enhanced more uniformly by providing bends also on the ITO to intentionally disperse light condensed by the aluminum film 104 when it is reflected by the ITO 105 and by repeating the dispersion and condensation of light by the upper and lower electrodes.

Figure 3A:
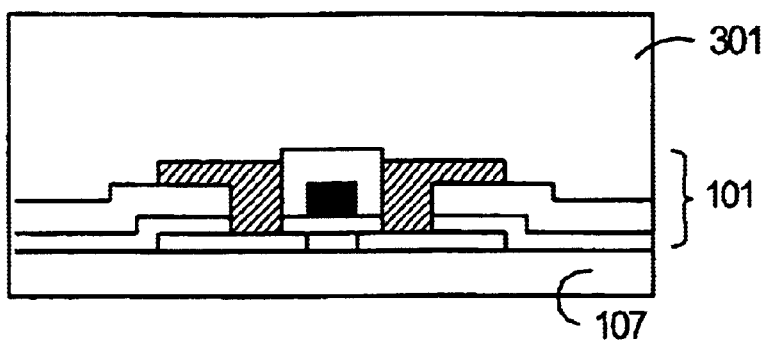
FIGS. 3a through 3d are diagrammatic views showing steps for fabricating the laminated type image sensor in FIG. 1.

The fabrication steps of the photoelectric conversion device of the present embodiment will be explained with reference to FIGS. 1, 3 and 6. At first, the top gate type MOS transistor 101 is formed and the polyimide flattening film 301 of 5 to 10 $\mu$m in thickness is provided thereabove as shown in FIG. 3a.

Figure 3B:
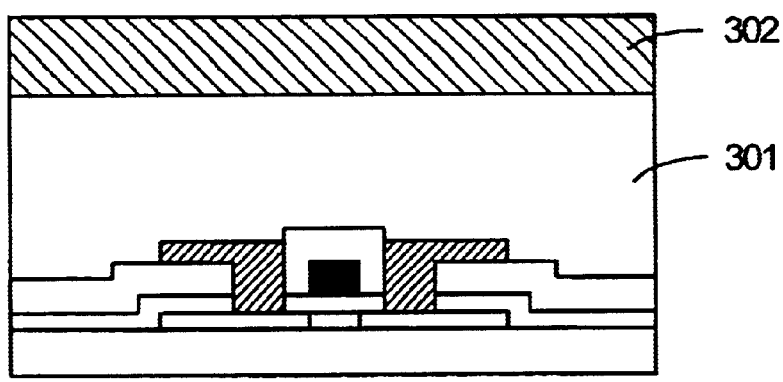

Next, the positive type resist 302 is formed on the polyimide flattening film 301 as shown in FIG. 3b. The resist is formed so as to have a thickness of 1 to 3.5 μm.

Figure 3C:
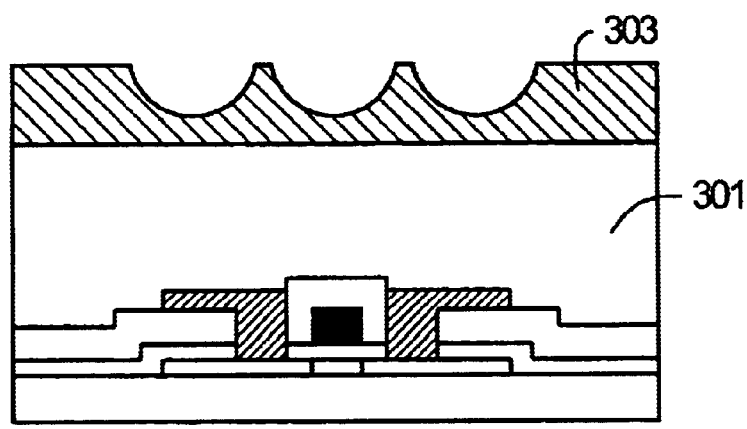
Figure 6A:
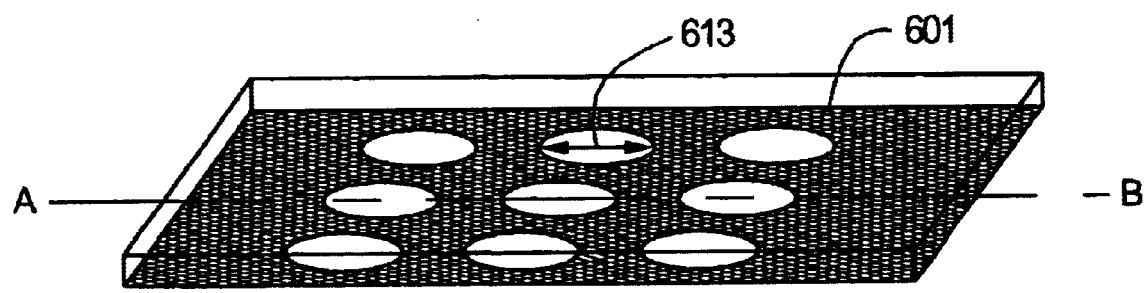
FIGS. 6a through 6c show a pattern of a mask and section views of the mask and a resist.
Figure 6B:
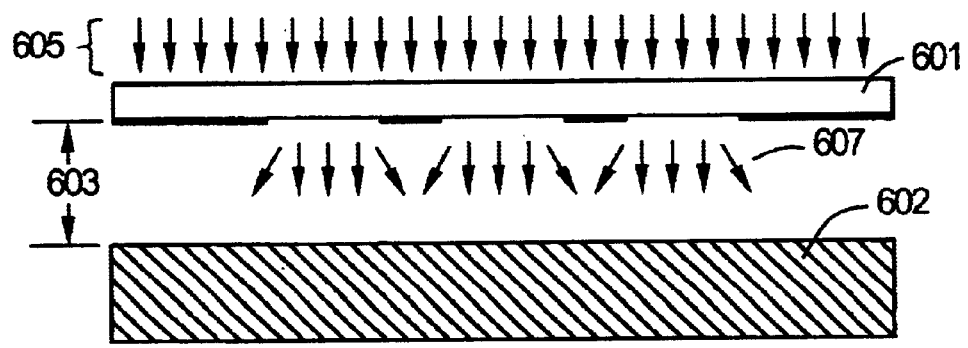
Figure 6C:
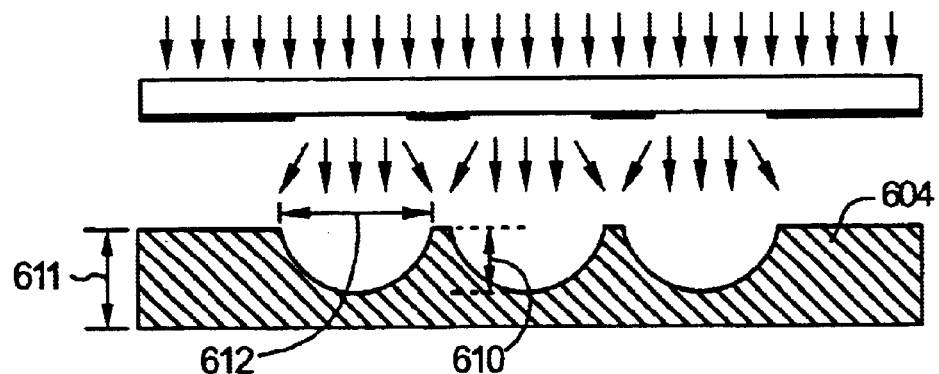

Then, the positive resist 302 is worked into a resist 303 having the concave bends as shown in FIG. 3c by slightly shifting a focusing depth of an optical system from the focused state during the exposure and by using a mask 601 on which a pattern in which circles are bored as shown in FIG. 6a is printed. The mask 601 in FIG. 6a corresponds to one pixel and nine bends of 3×3 are formed in one pixel in the present embodiment. A size 606 of the circles on the mask is designed to be 2 to 3 μm.

A mirror projection aligner (MPA) is used for the exposure unit. The mask is patterned as the bends by slightly shifting the focusing depth of the optical system of the MPA to blur the pattern in exposing the resist. A difference between the top and bottom of the bend is 0.5 to 3.5 μm which is almost same with or slightly smaller than the thickness 611 of the resist. A size 612 of the bend is 2 to 3.5 μm which is same with or slightly larger than a diameter 613 of the circle of the mask.

Next, RIE anisotropic etching is performed under the condition in which the etching rate is almost 1 to 1 in order to form the polyimide film 301 almost into the same shape with the bends of the resist 303 shown in FIG. 3c. The RIE anisotropic etching is performed by using etching gas in which $CF_4/O_2$ are mixed with a ratio of 5 to 95. The etching selection ratio between the resist and the polyimide may be set at almost 1 to 1 by using this etching gas.

Figure 3D:
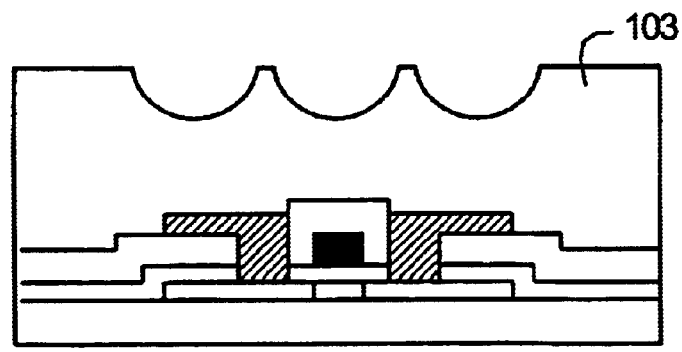

Although the RIE anisotropic etching is performed by using the etching gas in which $CF_4/O_2$ are mixed in the present embodiment, it is also possible to perform the RIE anisotropic etching by using other materials and under other conditions by which the etching selection ratio between the resist and the polyimide becomes from 1 to 1 to 1 to 2. It is also possible to etch the resist by the conventional dry etching. Thus, the polyimide film 103 having the concave bends as shown in FIG. 3d may be formed.

It is preferable to add a step of smoothing the surface of the polyimide film by setting a pre-baking temperature of the polyimide film and the resist at low and by baking the polyimide again after etching the polyimide almost in the same shape with the resist. At this time, the pre-baking is performed at 100 to 200° C. and the second baking is performed at 250 to 350° C.

After creating the nine concave bends on the polyimide film of one pixel, a contact hole is created and the aluminum film 104 is formed as shown in FIG. 1. The aluminum film 104 also has almost the same concave bends with the polyimide film 103. Thus, the concave bends whose reflectivity is large and which plays a role of condensing light are provided on the lower electrode.

Then, the amorphous silicon 106 and the ITO 105 are formed further to fabricate the intended image sensor shown in FIG. 1. The image sensor fabricated as described above and having the structure as shown in FIG. 1 allows the sensitivity to be enhanced uniformly even if the pixel is miniaturized.

Although the MPA has been used as the exposing unit in the present embodiment, the image sensor may be fabricated by using a stepper which allows a focusing depth to be controlled. The proximity method may be also used.

Further, although the difference between the top and bottom of the bend has been 0.5 to 3.5 μm in the present embodiment, it may be 0.25 to 4 μm. Still more, although the size 111 of the bend shown in FIG. 1 has been 2 to 3.5 μm in the present embodiment, it will do if it is larger than the contact hole for connecting the lower electrode with the signal transfer device and is smaller than the pixel.

Second Embodiment

A second embodiment pertains to a photoelectric converter in which a plurality of micro lenses are created above the image sensor of the first embodiment and to a fabrication method thereof.

The conversion efficiency may be enhanced by providing the plurality of micro lenses above the photoelectric conversion device of one pixel.

Figure 4:
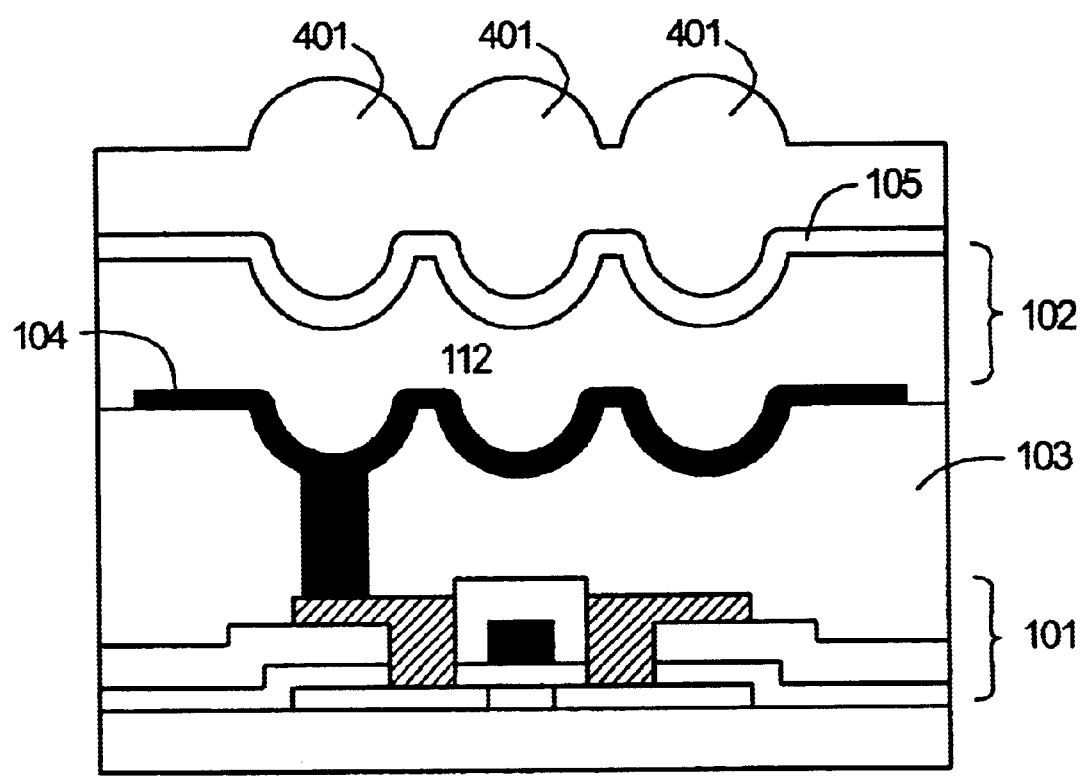
FIG. 4 is a diagrammatic view of another laminated type image sensor.

FIG. 4 is a section view of one pixel of the image sensor of the present embodiment. Three micro lenses 401 made of acrylic resin are provided above the photoelectric conversion device 102 of the image sensor of the first embodiment in the section view of FIG. 4. That is, nine micro lenses of 3×3 are provided on one pixel.

Figure 5A:
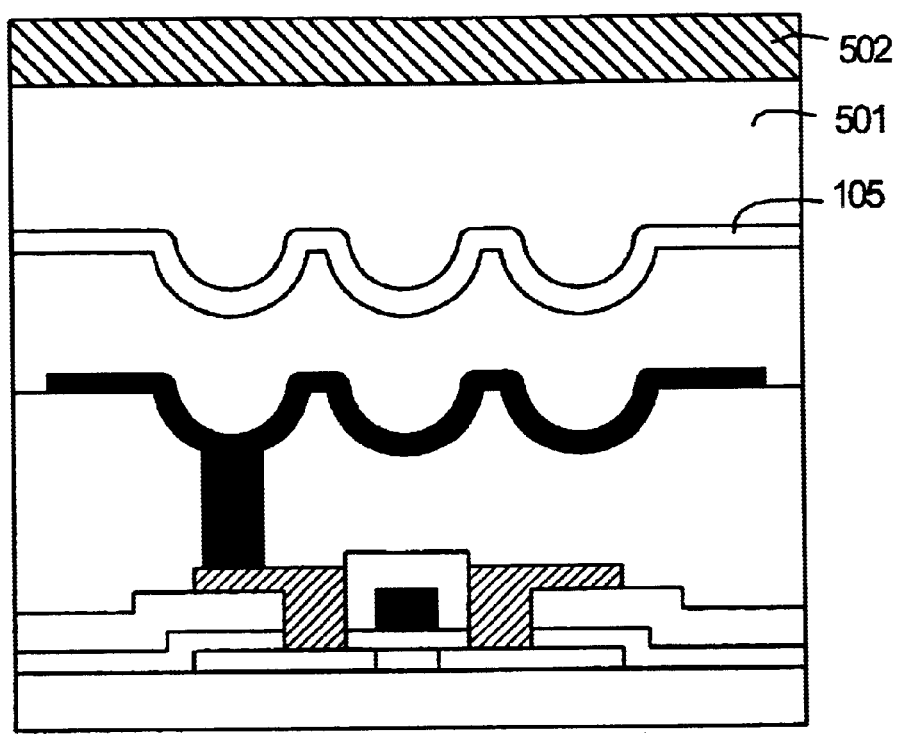
FIGS. 5a and 5b are diagrammatic views showing steps for fabricating the laminated type image sensor in FIG. 4.
Figure 5B:
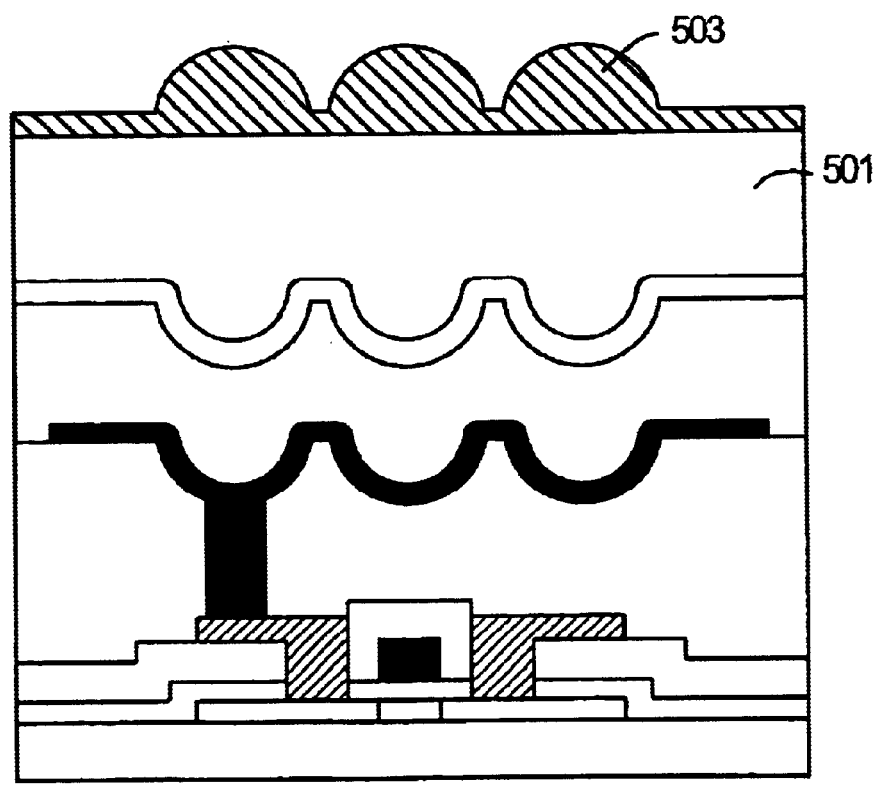
Figure 7A:
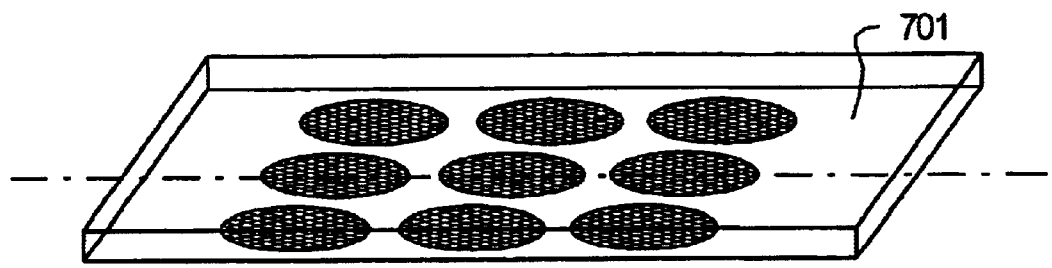
FIGS. 7a through 7c show a pattern of a mask and section views of the mask and a resist.
Figure 7B:
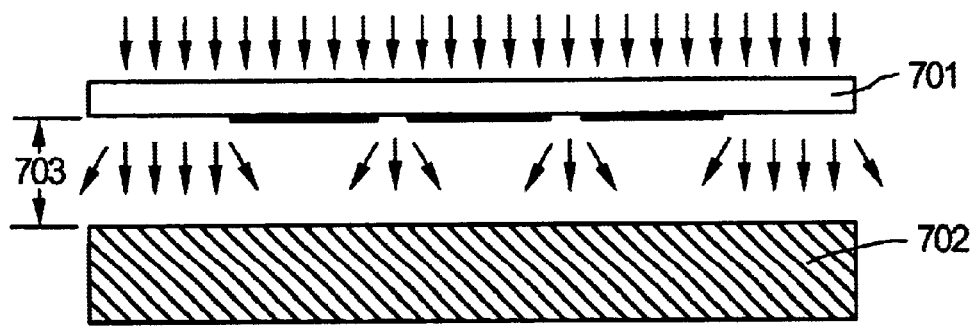

FIGS. 5 and 7 show steps for fabricating the image sensor of the present embodiment. At first, a flattening film 501 made of acrylic resin and having a thickness of 5 to 10 μm is formed on the ITO 105 which is the upper electrode of the photoelectric conversion layer of the image sensor of the first embodiment and a positive type resist 502 having a thickness of 2 to 4 μm is formed thereon as shown in FIG. 5a.

Figure 7C:
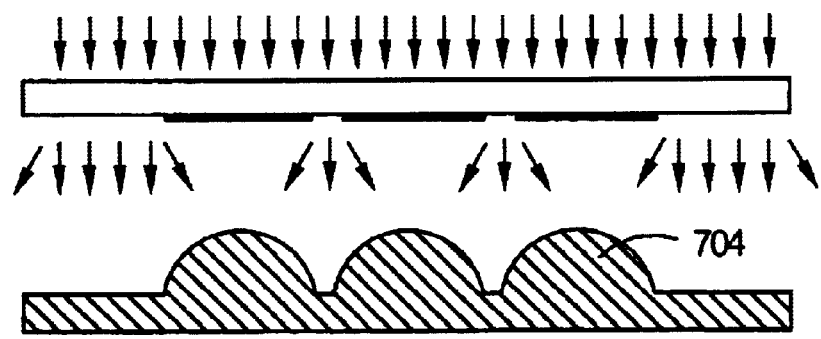

Then, a resist 704 (which corresponds to a resist 503 in FIG. 5b) having the bends as shown in FIG. 7c is formed by using a mask 701 (mask on which circle patterns are printed) on which a mask pattern that is almost inverse to the mask used in the first embodiment is formed and by patterning in the same manner with the first embodiment. The mask 701 corresponds to one pixel and the pattern of 3×3 circles is printed thereon. Accordingly, nine micro lenses may be formed on one pixel. A size 710 of the circle of the mask in FIG. 7a is 2 to 4 μm and the circles are disposed in the same manner with the mask in the first embodiment. Although the mask 701 shown in FIG. 7a is used in the present embodiment, the pattern of the mask may be different.

Then, the micro lenses 401 shown in FIG. 4 may be created by etching the resist 503 such that the etching selection ratio between the resist 503 and the acrylic resin flattening film 501 becomes from 1 to 1 to 1 to 2 or preferably almost 1 to 1.

The resist film is etched by using etching gas in which $CF_4/O_2$ are mixed in a ratio of 5 to 95 to create the acrylic resin film having convex curved faces. Although the etching gas of $CF_4/O_2$ is used in the present embodiment, another etching method in which the etching selection ratio between the resist 503 and the organic resin film 501 is 1 to 1 may be used.

The convex bends may be created by using the same positive resist by thus changing the mask pattern from that of the first embodiment.

The conversion efficiency may be enhanced by providing the plurality of lenses in one pixel like the present embodiment. Further, the double convex micro lenses 401 whose conversion efficiency may be enhanced more than the one-side convex micro lenses may be created by creating them so that the mask pattern of the lower electrode of the photoelectric conversion device corresponds to the mask pattern of the micro lenses.

As described above, the present invention can enhance the conversion efficiency by utilizing the reflection, condensation and dispersion of light and can enhance the sensitivity which has been problematic in reducing the size of the pixel of the image sensor. Further, because the present invention allows light to be controlled by intentionally condensing it, the sensitivity per pixel, which has been problematic in the prior art image sensor, may be equalized.

The present invention can enhance the sensitivity of not only the image sensor but also of the photoelectric converter having the photoelectric conversion devices and can equalize the sensitivity.

Further, the use of the present invention allows the limit of the size of one pixel in terms of the sensitivity to be reduced further.

While the preferred embodiments have been described, variations thereto will occur to those skilled in the art within the scope of the present inventive concepts which are delineated by the following claims.

What is claimed is:

1. A method for fabricating a photoelectric converter comprising;

forming a resist over a flattening film comprising organic resin;

providing said resist with a first bend;

etching said flattening film to provide said flattening film with a second bend below said first bend; and forming a lower electrode of said photoelectric converter over the etched flattening film provided with said second bend to provide said electrode with a third bend over said second bend.

2. A method for fabricating a photoelectric converter comprising;

forming a resist over a flattening film comprising organic resin;

providing said resist with a first bend;

etching said flattening film to provide said flattening film with a second bend below said first bend; and forming a lower electrode of said photoelectric converter over the etched flattening film provided with said second bend to provide said electrode with a third bend over said second bend, wherein said etching is performed with a selection ratio between said resist and said flattening film from 1:1 to 1:2.

3. A method for fabricating a photoelectric converter comprising;

forming a resist over a flattening film comprising organic resin;

providing said resist with a first bend;

etching said flattening film to provide said flattening film with a second bend below said first bend; and forming an electrode of said photoelectric converter over the etched flattening film provided with said second bend to provide said electrode with a third bend over said second bend, wherein a difference between a top and bottom of said first bend is 0.25 to 4 $\mu$m.

4. A method according to claim 1 wherein said electrode comprises a material selected from the group consisting of aluminum, molybdenum, tantalum, titanium, gold, silver and platinum.

5. A method according to claim 1 wherein said organic resin is selected from the group consisting of polyimide, polyamide, polyimide-amide and acrylic resin.

6. A method according to claim 1 wherein said flattening film is provided over a substrate.

7. A method according to claim 2 wherein said electrode comprises a material selected from the group consisting of aluminum, molybdenum, tantalum, titanium, gold, silver and platinum.

8. A method according to claim 2 wherein said organic resin is selected from the group consisting of polyimide, polyamide, polyimide-amide and acrylic resin.

9. A method according to claim 2 wherein said flattening film is provided over a substrate.

10. A method according to claim 3 wherein said electrode comprises a material selected from the group consisting of aluminum, molybdenum, tantalum, titanium, gold, silver and platinum.

11. A method according to claim 3 wherein said organic resin is selected from the group consisting of polyimide, polyamide, polyimide-amide and acrylic resin.

12. A method according to claim 3 wherein said flattening film is provided over a substrate.

13. A method according to claim 1 wherein said first bend has a length of 2 to 3.5 $\mu$m.

14. A method according to claim 2 wherein said first bend has a length of 2 to 3.5 $\mu$m.

15. A method according to claim 3 wherein said first bend has a length of 2 to 3.5 $\mu$m.

16. A method according to claim 3 wherein said electrode is a lower electrode of said photoelectric converter.

* * * * *